United States Patent [19]

Widmann

[11] 4,352,237

[45] Oct. 5, 1982

[54] METHOD FOR MANUFACTURE OF INTEGRATED SEMICONDUCTOR CIRCUITS, IN PARTICULAR CCD-CIRCUITS, WITH SELF-ADJUSTING, NONOVERLAPPING POLYSILICON ELECTRODES

[75] Inventor: Dietrich Widmann, Unterhaching, Fed. Rep. of Germany

[73] Assignee: Siemens Aktiengesellschaft, Berlin and Munich, Fed. Rep. of Germany

[21] Appl. No.: 187,773

[22] Filed: Sep. 16, 1980

[30] Foreign Application Priority Data

Sep. 28, 1979 [DE] Fed. Rep. of Germany ....... 2939456

[51] Int. Cl.³ .................. H01L 21/20; H01L 21/283
[52] U.S. Cl. .................................... 29/577 C; 29/571; 29/578; 29/579; 29/580; 148/174; 156/644; 156/653; 156/657; 156/662; 357/24; 357/59
[58] Field of Search ............... 29/571, 577, 578, 579, 29/580, 591; 148/174; 156/644, 653, 657, 662; 357/24, 59

[56] References Cited

U.S. PATENT DOCUMENTS

| | | | |
|---|---|---|---|
| 3,927,468 | 12/1975 | Anthony et al. | 357/24 X |
| 3,941,630 | 3/1976 | Larrabee | 357/24 X |
| 4,035,906 | 7/1977 | Tasch et al. | 29/578 |
| 4,055,885 | 11/1977 | Takemoto | 29/578 |
| 4,141,765 | 2/1979 | Druminski et al. | 156/657 X |
| 4,178,396 | 12/1979 | Okano et al. | 156/657 X |
| 4,240,196 | 12/1980 | Jacobs et al. | 29/578 |

OTHER PUBLICATIONS

Browne et al., "Nonoverlapping Gate Charge-Coupling . . . Application", IEEE J. Solid-State Circuits, vol. SC 11, No. 1, Feb. 1976, pp. 203-207.

*Primary Examiner*—W. G. Saba
*Attorney, Agent, or Firm*—Hill, Van Santen, Steadman, Chiara & Simpson

[57] ABSTRACT

In an exemplary embodiment, after underetching a first polysilicon layer beneath spaced SiO₂ cover layers to produce pairs of confronting SiO₂ overhangs with gaps therebetween, and providing an insulating layer at the end faces of the spaced poly-Si-1 electrodes formed from the first polysilicon layer, a second polysilicon layer is produced by chemical vapor deposition (CVD) so as to fill the cavities beneath the SiO₂ overhangs via the gaps between each pair of confronting overhangs. The second polysilicon layer is then etched away so as to leave intervening self-adjusting, nonoverlapping poly-Si-2 electrodes formed from the second polysilicon layer with surfaces terminating for example slightly below the upper surfaces of the SiO₂ cover layers. For a center-to-center spacing of poly-Si-1 electrodes of six microns, the SiO₂ overhangs may have an extent (e.g. 0.7 microns) about equal to the electrode layer thickness (e.g. 0.8 microns).

1 Claim, 10 Drawing Figures

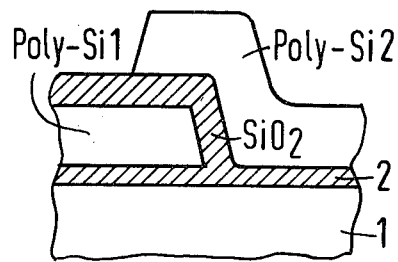
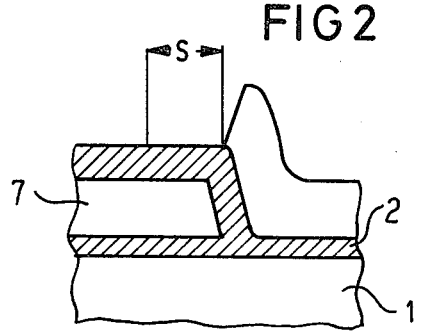
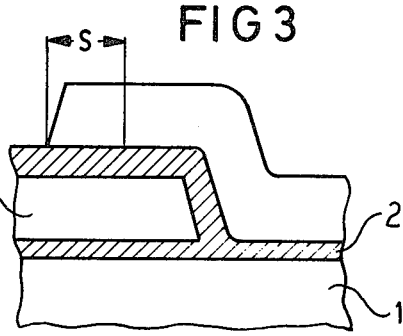
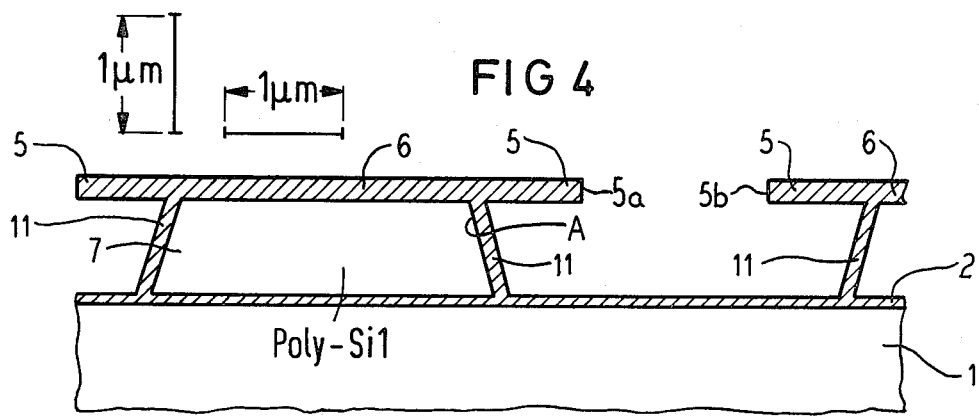

METHOD FOR MANUFACTURE OF INTEGRATED SEMICONDUCTOR CIRCUITS, IN PARTICULAR CCD-CIRCUITS, WITH SELF-ADJUSTING, NONOVERLAPPING POLYSILICON ELECTRODES

BACKGROUND OF THE INVENTION

The present invention relates to a method for manufacturing integrated semiconductor circuits, in particular CCD-circuits, with self-adjusting, nonoverlapping polysilicon electrodes in which the length of the electrodes is of the order of magnitude of the layer thicknesses.

In the known double-silicon-gate processes ($Si^2$-gate-processes), as a general rule, in accordance with the known manufacturing processes, an unavoidable overlapping of the polysilicon electrodes of the second polysilicon structure level with the polysilicon electrodes of the first polysilicon structure level occurs.

Such an overlapping is undesirable on account of the increased coupling capacitance between poly-Si-1 and poly-Si-2 electrodes as well as also on account of the restricted packing density of the electrodes.

From "IEEE Journal of Solid-State Circuits Vol. SC 11, No. 1, February 1976", a process for producing self-adjusting, nonoverlapping aluminum electrodes with the aid of anodic oxidation and the so-called lift-off technique is known; cf. pp. 203–207 therein: "V. A. Browne and K. D. Perkins: A Non-overlapping Gate Charge-Coupling Technology for Serial Memory and Signal Processing Applications".

A technology for manufacturing integrated semiconductor circuits in which electrodes consisting of polysilicon which do not overlap are exclusively employed is not known up to the present time.

SUMMARY OF THE INVENTION

The object underlying the invention resides in creating a method of manufacture for the production of integrated semiconductor circuits; in particular CCD-circuits, by means of which the overlappings—unavoidable in the case of the known manufacturing methods—of the first with the second electrode structure are avoidable.

The object underlying the invention is achieved by a method for the manufacture of integrated semiconductor circuits, in particular CCD-circuits, with which self-adjusting, nonoverlapping polysilicon electrodes can be produced in two levels.

The inventive method is characterized in that, during the etching of polysilicon electrodes of a first type of poly-Si-1, the asking $SiO_2$ or $Si_3N_4$ structure, in order to produce overhangings of the $SiO_2$ or $Si_3N_4$ layer covering the electrodes, are laterally underetched to such an extent that an overhang (5) with a prescribed minimal length results, that subsequently the now-existing edges of the poly-Si-1 structures are coated with an $SiO_2$ layer for the purpose of insulation, and that subsequent thereto, the entire surface of the circuit structure is coated with a second polysilicon layer poly-Si-2 by means of chemical vapor deposition (CVD), known per se, whereby, corresponding to the properties of the chemical vapor deposition (CVD) technique, which is known per se, not only the cavities beneath the overhangs (5), but, given a sufficiently small spacing of the edges of the $SiO_2$ cover film, also the intermediate space between the poly-Si-1 electrodes are completely filled up, and that, in a following process step, the second polysilicon layer poly-Si-2 is etched, with an etching process, which is likewise known per se, to such an extent that its surface in each instance terminates at least with the surface of the $SiO_2$ film covering the poly-Si-1 structure in this manufacturing phase, whereby the required nonoverlapping overall structure results.

The invention offers the advantage that the overlappings, bringing about interfering, undesired capacitances between adjacent electrodes within a respective integrated circuit arrangement, for example a CCD-arrangement, which overlappings are generally unavoidable due to fabrication tolerances, can be eliminated by simple means.

Further developments of the invention are characterized by the features disclosed in the subclaims.

In the following, the invention shall be explained on the basis of several Figures on the accompanying drawing sheets relating to the state of the art and exemplary embodiments of the invention; and other objects, features and advantages will be apparent from this detailed disclosure and from the appended claims.

BRIEF DESCRIPTION OF THE DRAWINGS

FIG. 1 schematically illustrates the cross-section of a partial zone of a circuit structure manufactured according to a conventional method, in which a poly-Si-1 layer and a poly-Si-2 layer overlap.

FIG. 2 schematically illustrates the cross-section of a partial zone of a circuit structure manufactured according to a conventional method in which the second polysilicon layer is displaced by an amount s which corresponds to an edge position error in a direction laterally away from the respective electrode of the first polysilicon layer (7);

FIG. 3 schematically illustrates the cross-section of a partial zone of a circuit structure manufactured according to a conventional method in which the second polysilicon layer is displaced by an amount s corresponding to an edge position error in the direction laterally toward the respective electrode of the first polysilicon layer (7);

FIG. 4 schematically illustrates the cross-section of a circuit structure, which is not yet entirely constructed in accordance with the invention, with a poly-Si-1 electrode (7), illustrated sectionally which is covered with an $SiO_2$ layer exhibiting an overhang (5) on both sides of an intermediate section (6), the spacing of the confronting edges (5a, 5b) of said $SiO_2$ layer being on the order of magnitude of the poly-Si-1 layer thickness (e.g. 1 $\mu$m with 0.5 $\mu$m poly-Si-1 thickness);

DETAILED DESCRIPTION

The foregoing Brief Description of Drawings is referred to for an introductory detailed description. Further introductory background can be obtained from my German application No. P 29 39 488.5 filed Sept. 28, 1979, and the related U.S. application Ser. No 187,774, filed Sept. 16, 1980.

Figure 5:
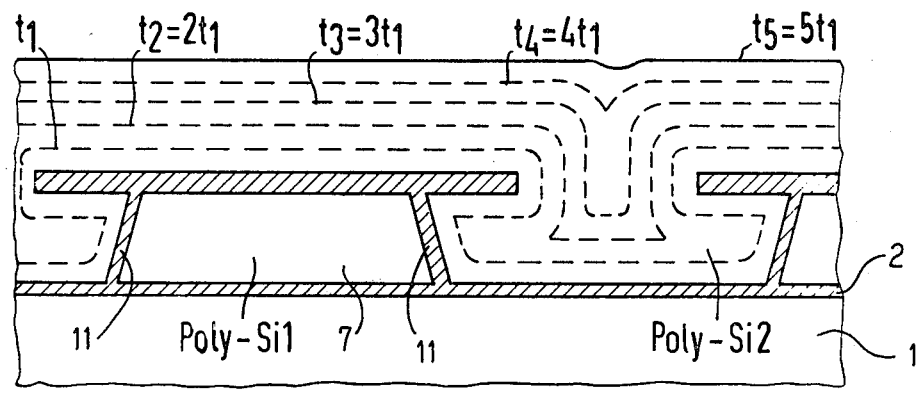
FIG. 5 schematically illustrates the circuit structure, constructed according to FIG. 4, on which, by means of gas phase deposition, the poly-Si-2 layer is applied.
Figure 6:
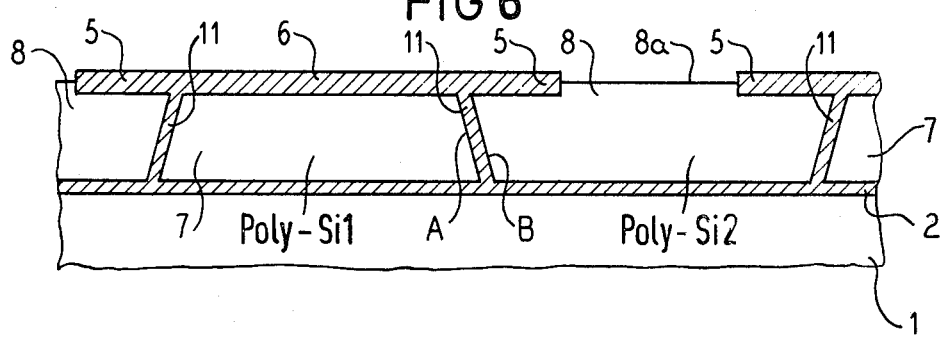
FIG. 6 schematically illustrates the cross-section of a circuit structure resulting, after etching-away, in a remaining poly-Si-2 layer (8), in which no significant overlapping whatsoever is present, with the exception of the minimum overlappings of the electrodes (7 and 8) resulting from the illustrated oblique (or inclined) edges (at A and B)
Figure 7:
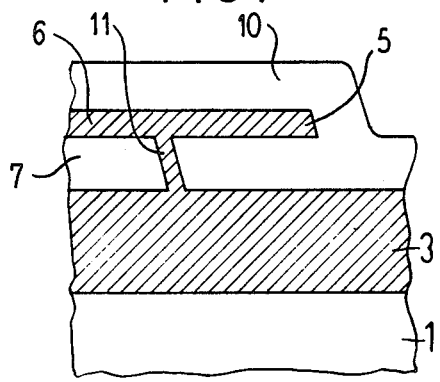
FIG. 7 schematically illustrates the cross-section of a partial zone at the periphery of the previously cited circuit arrangement in which a second polysilicon layer (10) is applied beneath and above an inventive overhang (5) of the $SiO_2$ layer.
Figure 8:
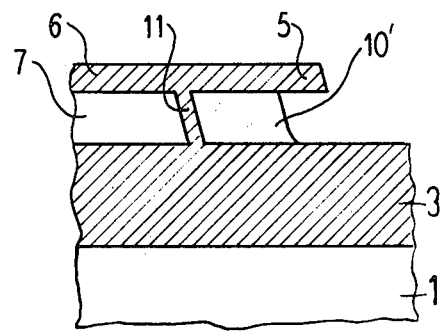
FIG. 8 schematically shows the cross-section of a partial zone of the circuit arrangement according to FIG. 7 in which, after etching-away a specific layer thickness of the second polysilicon layer (10), a residue (10′) of this second polysilicon layer remains in the cavity beneath the overhang (5) of the SiO₂ film.

As previously explained, FIGS. 4 through 6 illustrate, in several steps, the manufacture of an integrated circuit arrangement, preferably a CCD-circuit with self-adjusting, nonoverlapping electrodes, in which circuit arrangement the polysilicon electrodes 7 and 8 are relatively narrow; i.e., their lateral extent as viewed in FIG. 6 falls in the order of magnitude of the layer thicknesses of layers 7 and 8. With this given prerequisite, it is possible, with the aid of chemical vapor deposition CVD, to completely fill out the cavities beneath the overhangs 5, cf. FIG. 4, with application of the poly-Si-2 layer; cf. FIG. 5. In FIG. 5, the layer thicknesses which have resulted, respectively, at specific times $t_1 \ldots t_5$ are schematically illustrated by the broken lines.

FIG. 6 schematically illustrates, as previously likewise explained, the cross-section of a circuit structure manufactured according to the disclosed method. It is clearly recognizable that the two adjacent electrodes 7 and 8 overlap only insignificantly; namely, brought about by the inclined (or oblique) edges A and B. A low-capacitance arrangement is thus provided.

An advantageous further development of the invention provides that the application of the SiO₂ layer 11, FIGS. 4–8, and 13, FIGS. 9 and 10, proceeds by means of thermal oxidation after etching of the poly-Si-2 layer, whereby, due to the fact that the layer thickness at the edges becomes relatively large, the degree of the cited insignificant overlapping between ends such as A and B, FIG. 6, is further reduced.

Figure 9:
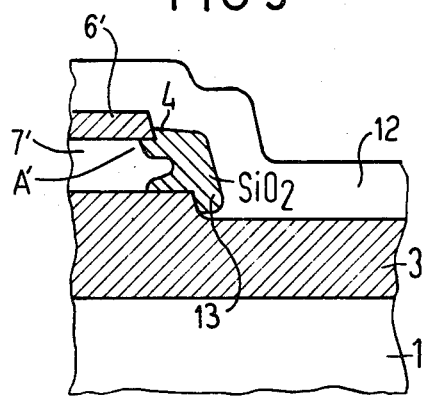
FIG. 9 schematically illustrates the cross-section of a partial zone of the periphery of the respective circuit structure in which, prior to application of the second polysilicon layer (12), the overhang of the SiO₂ layer 10 has been eliminated.
Figure 10:
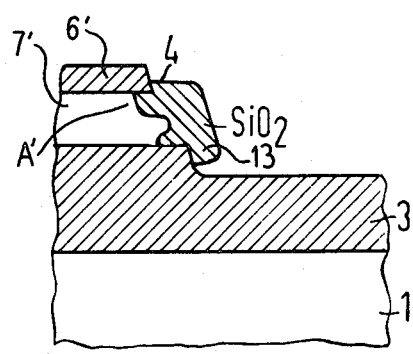
FIG. 10 schematically illustrates the cross-section of the partial zone—illustrated in FIG. 9—of the respective circuit structure, in which the second polysilicon layer (12) is etched away in the zones of the SiO₂-layer (6′), disposed above the first polysilicon layer (7′), and in the zones of field oxide layer (3).

Another further development of the invention provides that, in those zones, preferably in the peripheral zones such as shown in FIGS. 7 through 10, in which the produced poly-Si-2 paths, which e.g. have the function of interconnections, can intersect the poly-Si-1 paths, the overhangs 5, prior to the deposition of the second polysilicon layer 12 of poly-Si-2 are etched away (FIG. 9) to leave only portions 6′, by means of process steps which are known per se, to such an extent that all respectively resulting contact hole edges 4, FIG. 9, are positioned on the surfaces of the pertaining electrodes 7′, so that, after etching-away of the second polysilicon layer 12 of poly-Si-2, FIG. 10, no residues of the second polysilicon layer 12 of poly-Si-2, causing short circuits, remain in the cited zones; cf. FIGS. 7 through 10.

In the following, a series of process steps is disclosed with the aid of which the desired circuit structure can be manufactured:

1. Production of the field oxide zones 3, FIGS. 7–10; for example, with the aid of the known LOCOS-technology.

2. Production of the gate oxide zones 2, FIGS. 4–6.

3. If desired, implantation of dopant in specified gate-zones; for example, for the purpose of adjustment of the threshold voltage of transistors.

4. Deposition of a first n+-doped polysilicon layer 7, FIGS. 4–10, of poly-Si-1 with the aid of chemical vapor deposition (CVD) at approximately 700° C.; thickness of the poly-Si-1 layer 7 approximately 0.8 μm. (An n-channel-MOS-technology is here described; however, the considerations also apply in the same manner to a p-channel-MOS-technology.)

5. Deposition of an SiO₂ layer 5, 6 or thermal oxidation of the polysilicon layer 7 to produce the layer 5, 6; thickness of the SiO₂ layer 5, 6 in the range of 0.05 to 0.5 μm. This SiO₂ layer 5, 6, however, can, possibly, also be entirely omitted.

6. Etching of the SiO₂ layer 5, 6 so that the SiO₂ layer remains where poly-Si-1 structures 7 are to result. The SiO₂ bars 5, 6 in the CCD-channel zone are assumed to be e.g. 4.4 μm wide; the spacing between edges such as 5a, 5b, FIG. 4, is assumed to be 1.6 μm.

The formation of the overhangs such as 5, FIG. 4, is particularly the subject of my above-referenced German and U.S. applications for patent, application Ser. No. 187,774, filed Sept. 16, 1980.

7. Etching-away of the masking SiO₂ layer 5 in the vicinity of the poly-Si-1 edges A′, FIGS. 9 and 10, in regions outside the CCD channel in order to avoid short circuits between adjacent poly-Si-2 tracks, as described above, cf. FIGS. 7, 8, 9, 10.

8. Thermal oxidation: an SiO₂ layer 11, FIGS. 4–8, and/or 13, FIGS. 9 and 10, in a thickness of 0.05 to 0.3 μm, thickness here grows on the poly-Si-1 edges A, FIG. 4, or A′, FIG. 9, whereas the gate oxide 2 in the zones not covered by poly-Si-1 grows somewhat further. In case this is not desired, the zones of the gate oxide 2 not covered by poly-Si-1 can be etched away prior to thermal oxidation; cf. FIG. 4.

9. If desired, implantation of dopant into the exposed gate oxide zones for the purpose of adjustment of the surface potential at the Si/SiO₂ boundary surface beneath the poly-Si-2 electrodes (e.g. to be formed at 8, FIG. 6).

10. Deposition of a second n+-doped polysilicon layer (poly-Si-2) with the aid of chemical vapor deposition (CVD) at approximately 700° C. The thickness of the poly-Si-2 layer 8 up to surface 8a is to amount to approximately one micron (1 μm). During gas phase deposition the polysilicon layers show the growth behavior illustrated in FIG. 5. The surface contours are virtually uniformly coated with polysilicon. At the same time, the intermediate space between the poly-Si-1 electrodes 7 is also filled up from the side, so that, finally, a considerably thicker polysilicon layer grows in these zones. This effect is employed for producing self-adjusting, nonoverlapping poly-Si-2 electrodes 8.

11. Etching of the poly-Si-2 layer of FIGS. 5, 7 and 9. The poly-Si-2 layer is here, in a conventional fashion, covered with a resist mask everywhere where poly-Si-2 zones are to result. However, differing from this conventional masking, here masking with resist is not carried out in the zone of the CCD-electrodes. The poly-Si-2 layer is then removed to such an extent that poly-Si-2 remains only beneath the resist mask, as well as at 8 between the poly-Si-1 electrodes 7, cf. FIG. 6.

12. Production of an insulating layer (e.g. $SiO_2$).
13. Etching of contact holes.
14. Production of metal interconnections.

All process steps, with the exception of steps (10) and (11), are conventional per se. However, the electrode width and the poly-Si-2 layer thickness are not selectable independently of one another (cf. disclosed numerical example).

If steps (8) and (12) are carried out with the aid of a thermal oxidation, the $SiO_2$ layer 11, FIGS. 4–7, or 13, FIGS. 9 and 10, between poly-Si-1 and poly-Si-2 electrodes (e.g. electrodes 7 and 8) also grows somewhat further, so that the coupling capacitance can be advantageously further reduced.

The process sequence schematically illustrated in FIGS. 4, 5, 6 can be generally employed for the purpose of filling up narrow grooves (or channels) with polysilicon.

It will be apparent that many modifications and variations may be effected without departing from the scope of the novel concepts and teachings of the present invention.

I claim as my invention:

1. In a method for manufacturing self-adjusted nonoverlapping polysilicon electrodes (poly-Si-1 and poly-Si-2) in integrated CCD semiconductor circuits wherein the lateral extent of the electrodes is comparable in magnitude to the layer thickness, and wherein a polysilicon-1-electrode (7) is first formed with a masking layer thereon of $SiO_2$ or $Si_3N_4$, said method further comprising:

(a) etching the polysilicon-1-electrodes (7) during the presence of said masking layer (5, 6) of $SiO_2$ or $Si_3N_4$ in covering relation thereto, (b) carrying out the etching of the polysilicon-1-electrodes (7) to such degree that lateral underetching occurs at the edges (5a, 5b) of the masking layer (5, 6) covering the polysilicon-1-electrodes (7) to form overhangs (5) of the masking layer (5, 6) with the overhangs (5) of the masking layer (5, 6) having a prescribed minimum length, (c) carrying out a thermal oxidation step whereby the edges (A) of the polysilicon-1-electrodes are covered with $SiO_2$ layers (11), and (d) applying a second polysilicon layer by means of a chemical vapor deposition step known per se, for producing polysilicon-2-electrodes (8) and carrying out this applying step such that not only are the hollows under the overhangs (5) filled with silicon but also where the edges (5a, 5b) have a spacing of a magnitude comparable to the layer thickness, the interstice between the polysilicon-1-electrodes (7) is also completely filled with silicon; and (e) eroding the second polysilicon layer by means of an etching step known per se to such degree that the surface of the second polysilicon layer terminates substantially with the surface of the $SiO_2$ or $Si_3N_4$ masking layer (6) covering the polysilicon-1-electrodes (7).

* * * * *